(12) United States Patent
Yang

(10) Patent No.: US 6,185,125 B1
(45) Date of Patent: Feb. 6, 2001

(54) CIRCUIT FOR MEASURING THE DATA RETENTION TIME OF A DYNAMIC RANDOM-ACCESS MEMORY CELL

(75) Inventor: Shih-Hsien Yang, Tao-Yuan (TW)

(73) Assignee: Winbond Electronics Corp., Hsinchu (TW)

(*) Notice: Under 35 U.S.C. 154(b), the term of this patent shall be extended for 0 days.

(21) Appl. No.: 09/461,875

(22) Filed: Dec. 15, 1999

(51) Int. Cl.[7] .................................................. G11C 11/24
(52) U.S. Cl. ............................................. 365/149; 365/201
(58) Field of Search .................................... 365/149, 201, 365/150, 222

(56) References Cited

U.S. PATENT DOCUMENTS

| | | | |
|---|---|---|---|
| 5,654,913 | * | 8/1997 | Fukushima et al. ................. 365/149 |
| 5,748,544 | * | 5/1998 | Hashimoto ........................... 365/201 |
| 6,097,646 | * | 8/2000 | Fournel ................................. 365/201 |

* cited by examiner

*Primary Examiner*—Richard Elms
*Assistant Examiner*—Anh Phung
(74) *Attorney, Agent, or Firm*—Jiawei Huang; J.C.Patents

(57) ABSTRACT

The invention provides a circuit for precisely measuring a retention time of a memory cell of a DRAM. The circuit includes at least includes a DRAM memory cell and a periphery MOS device. The DRAM memory cell includes, for example, an N-type MOS (NMOS) transistor with a capacitor. The NMOS transistor has a source region coupled to a lower electrode of the capacitor, a drain region coupled to a first voltage, and a gate electrode coupled to a second voltage. The capacitor is also coupled to a third voltage at its upper electrode. The periphery MOS device includes a gate electrode coupled to the NMOS transistor at a node between the NMOS transistor and the capacitor. A drain region of the periphery MOS device is coupled to a fourth voltage, and a source region of the periphery MOS device is coupled to a fifth voltage. Moreover, the circuit includes another periphery MOS device, which is coupled to the previous periphery MOS device in parallel, but the gate electrode of the periphery MOS device is coupled to a sixth voltage.

10 Claims, 4 Drawing Sheets

CIRCUIT FOR MEASURING THE DATA RETENTION TIME OF A DYNAMIC RANDOM-ACCESS MEMORY CELL

BACKGROUND OF THE INVENTION

1. Field of the Invention

This invention relates to DRAM (Dynamic Random-Access Memory) technology, and more particularly to a circuit for measuring the data retention time of a DRAM cell.

2. Description of Related Art

As DRAMs are fabricated to higher levels of integration, the data-storage capacitors in the DRAM are downsized to a level that reduces the data-retention capability thereof. In DRAM design and fabrication, the DRAM data retention time is an important factor that determines the reliability of the DRAM. The longer the retention time, the better the reliability of the DRAM is.

Therefore, during the fabrication of DRAM, measurement of the data retention time is required. A low data retention time causes error in data read when the DRAM is used to store data.

FIG. 1 is a schematic diagram of a conventional source-follower circuit which is an equivalent of a DRAM cell. As shown, the source-follower circuit includes an NMOS transistor 10 having a gate connected to an input voltage $V_{in}$, a drain connected to a system voltage VC, and a source connected via a load resistor 12 to a second system voltage VS. The load resistor 12 allows the output voltage $V_{out}$ at the source of the NMOS transistor 10 to follow the input voltage $V_{in}$ at the gate of the NMOS transistor 10.

One drawback to the use of the source-follower circuit of FIG. 1 for DRAM data retention time measurement, however, is that the RC delay caused by the load resistor 12 considerably affects the accuracy of the measurement.

Moreover, it is highly difficult to obtain the $V_{out}$-$V_{in}$ characteristic of the source-follower circuit with respect to the load resistor 12; therefore, the use of the source-follower circuit of FIG. 1 makes the testkey design very difficult to implement.

In DRAMs, leakage current from the capacitor is the major cause of a low data retention time. The information about the length of the data retention time of a DRAM device is therefore an important factor by which the reliability of the DRAM is evaluated.

The measurement for DRAM data retention time is typically taken during the test phase of the DRAM product. However, it is usually desirable that the measurement be taken during the WAT test so that any DRAM device with a low data retention time can be found early for correction by the fabrication engineers.

Moreover, for a DRAM cell whose capacitor is based on a deep-trench (DT) structure, the knowledge of the data retention time can help the design to reduce the leakage current from the capacitor. When the DRAM cell is downsized, i.e., when the DT structure and NO film in the capacitor are reduced in size, the modeling for leakage current and retention time becomes more critical. In this case, the measurement can be restricted by the capacity for bonding pads and parasitic capacitance in the DRAM chip.

FIG. 2A is a schematic, cross-sectional diagram showing the semiconductor structure of a conventional DRAM cell, and FIG. 2B is a schematic diagram showing the equivalent circuit structure of the DRAM cell of FIG. 2A.

As shown, the DRAM cell 20 includes an NMOS transistor 22 and a data-storage capacitor 24. An equivalent resistor 26 is formed from the combination of the deep-trench resistor RDT and the buried-strap resistor RBS between the NMOS transistor 22 and the capacitor 24. A contact resistor RCB 28 is formed between the drain of the NMOS transistor 22 and the bit line VBL. Furthermore, the capacitor 24 is connected to a buried-plate voltage VBP.

There exist two kinds of leakage currents in the DRAM cell 20: one is the reverse current at the buried PN junction, and the other is the leakage current from the deep-trench NO film. These two kinds of leakage currents significantly reduce the data retention time of the DRAM cell 20.

A conventional method for measuring the data retention time of a DRAM cell is to measure the voltage changes at the node SN between the capacitor 24 and the source of the NMOS transistor 22, which indicates the changes of the voltage across the capacitor 24. One drawback to this method, however, is that the accuracy of the measurement is affected by the parasitic capacitance in the DRAM cell 20.

SUMMARY OF THE INVENTION

The invention provides a circuit for at least an objective to more precisely measure a retention time of a memory cell in a DRAM. This feature effectively solves the conventional problem that the retention time of a memory cell can not be precisely measured due to an effect of parasitic capacitance.

In order to achieve at least the forgoing objective, the circuit preferably includes a periphery MOS device, which is coupled to a memory cell of the DRAM so as to precisely measure a current leakage of a capacitor of the memory cell. The status of the current leakage can be further derived to obtain a precise retention time of the memory cell of the DRAM without affection from the parasitic capacitance.

According to at least the forgoing objective, the invention provides a circuit for precisely measuring a retention time of a memory cell of a DRAM. The circuit includes at least includes a DRAM memory cell and a periphery MOS device. The DRAM memory cell includes, for example, an N-type MOS (NMOS) transistor with a capacitor. The NMOS transistor has a source region coupled to a lower electrode of the capacitor, a drain region coupled to a first voltage, and a gate electrode coupled to a second voltage. The capacitor is also coupled to a third voltage at its upper electrode. The periphery MOS device includes a gate electrode coupled to the NMOS transistor at a node between the NMOS transistor and the capacitor. A drain region of the periphery MOS device is coupled to a fourth voltage, and a source region of the periphery MOS device is coupled to a fifth voltage. Moreover, the circuit includes another periphery MOS device, which is coupled to the previous periphery MOS device in parallel, but the gate electrode of the periphery MOS device is coupled to a sixth voltage.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

First Preferred Embodiment

Figure 1:
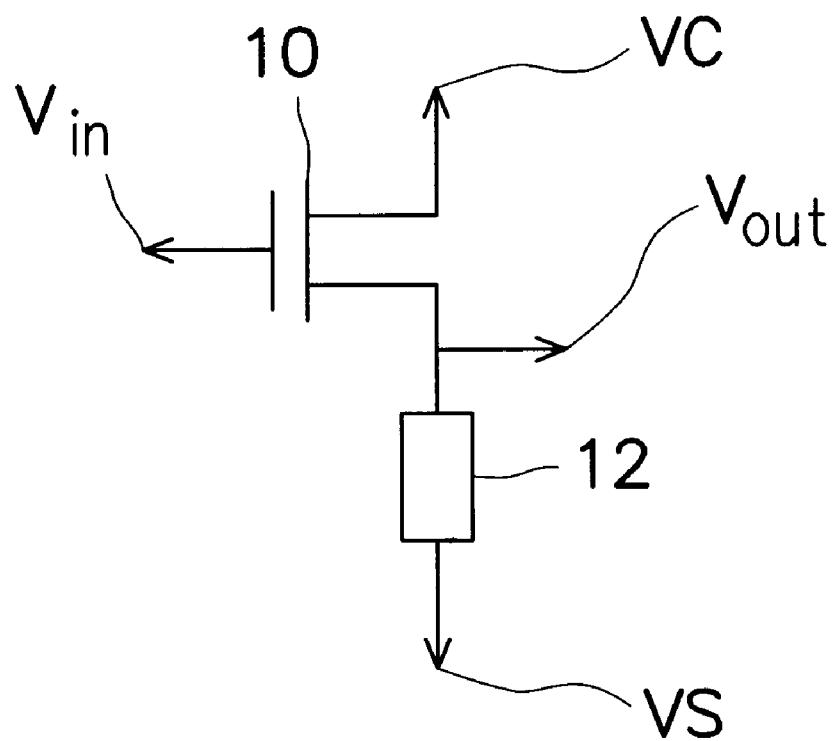
FIG. 1 is a schematic diagram of a conventional source-follower NMOS transistor.
Figure 2A:
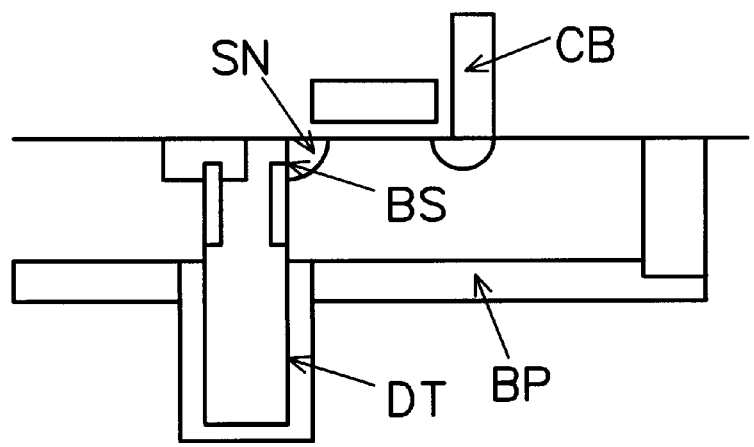
FIG. 2A is a schematic, cross-sectional diagram showing the semiconductor structure of a conventional DRAM cell.
Figure 2B:
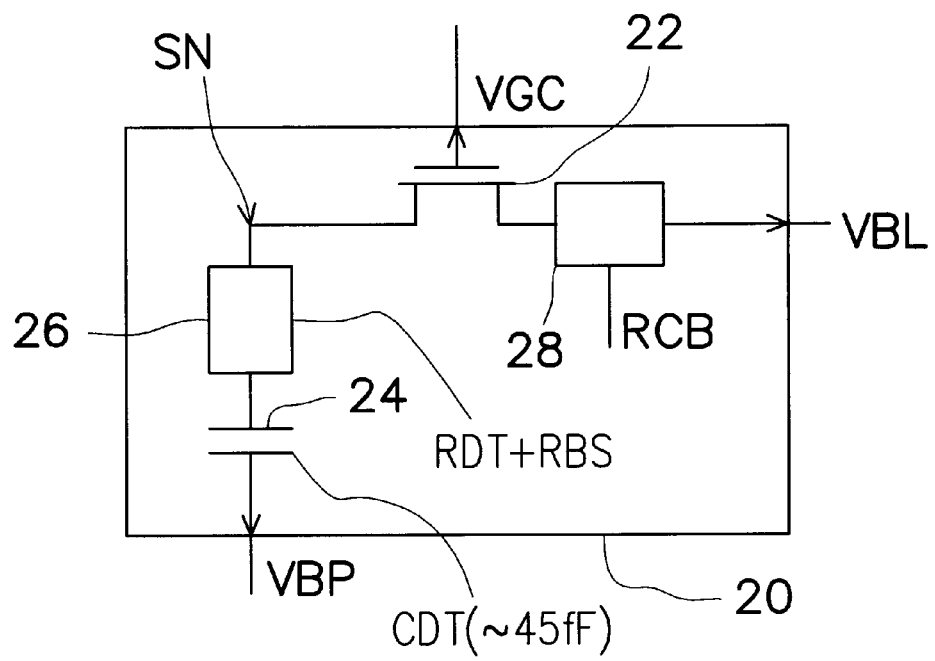
FIG. 2B is a schematic, cross-sectional diagram showing the equivalent circuit structure of the DRAM cell of FIG. 2A.
Figure 3:
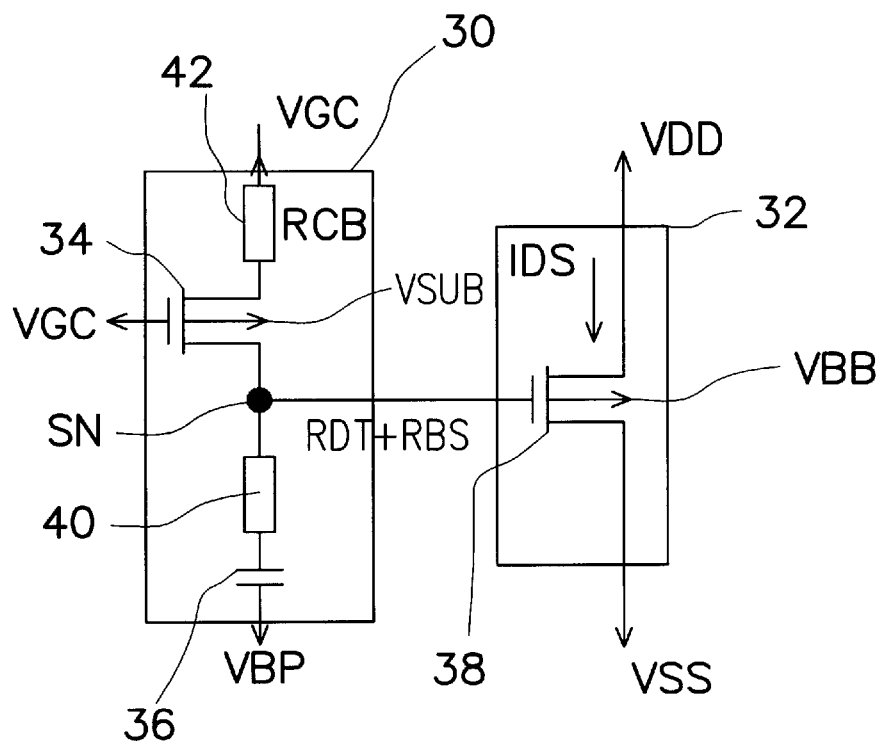
FIG. 3 is a schematic diagram showing the circuit configuration of a DRAM cell coupled with an periphery circuit used to perform the first preferred embodiment of the invention.

A first preferred embodiment of the invention for DRAM data retention-time measurement is disclosed in the following with reference to FIG. 3.

The invention introduces a measuring circuit to measure the data retention time of a DRAM cell 30 including an NMOS transistor 34 and a data-storage capacitor 36, in which an equivalent resistor 40 is formed from the combination of the deep-trench resistance RDT and the buried-strap resistance RBS between the NMOS transistor 34 and the capacitor 36, and a contact resistor RCB 42 is formed between the drain of the NMOS transistor 34 and the system voltage VCC which is supplied by way of a bit line (not shown). The resistor 40 is connected to a buried-plate voltage VBP.

In accordance with the invention, a periphery circuit 32, which in this embodiment includes only a NMOS transistor 38, is coupled to the DRAM cell 30 in such a manner that the gate of the NMOS transistor 38 is connected to the node SN between the capacitor 36 and the source of the NMOS transistor 34.

In accordance with the invention, taking the measurement of the data retention time of the DRAM cell 30 includes the following procedural steps.

(Step 1)

Figure 5A:
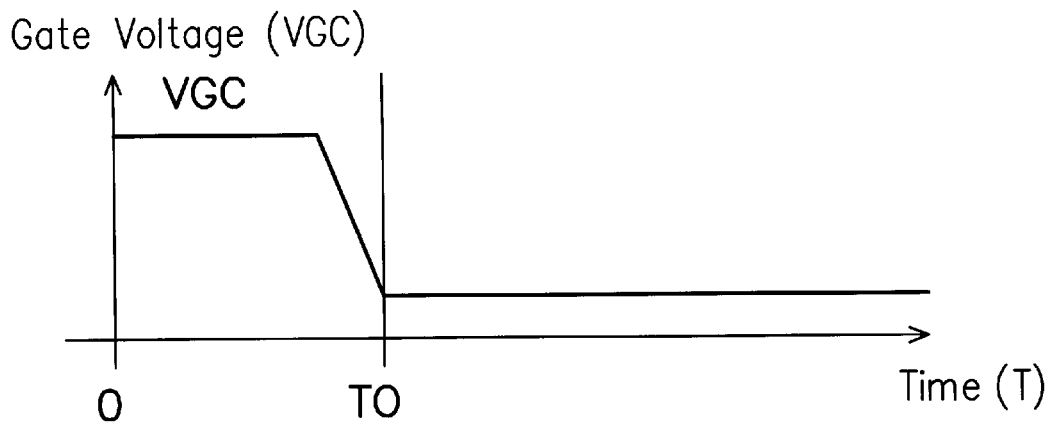
FIG. 5A is a graph, showing the waveform change in the gate voltage applied to the NMOS transistor in the DRAM cell during data retention time measurement.

The first step is to apply a gate voltage VGC of a high-voltage state between 3.75 V and 4 V to the gate of the NMOS transistor 34, whereby the NMOS transistor 34 is switched to the ON state as illustrated in FIG. 5A (the period from T=0 to T=T0). Meanwhile, a voltage VCC of 1.8 V representative of a high-voltage data bit, or 0 V representative of a low-voltage data bit, is applied to the contact resistor RCB 42, which is then retained by the resistor 40. The voltage VCC in the embodiment is not limited to the 1.8 V, and the quantities, for example, can be 2V, 2.5V, or higher. Moreover, a buried-plate voltage VBP of 1 V is applied to the capacitor 36, and a substrate voltage VSUB of –0.5 V is applied to the substrate of the NMOS transistor 34.

(Step 2)

In the second step, for the periphery circuit 32, the system voltage VDD is maintained at its constant level, the system voltage VSS is maintained at its zero bias level, and the differential voltage of the NMOS transistor 38 is maintained at a constant level.

(Step 3)

In the third step, during T=0 to T=T0, the capacitor voltage VSN at the node SN is pumped until reaching a voltage level equal to VCC.

(Step 4)

Figure 5B:
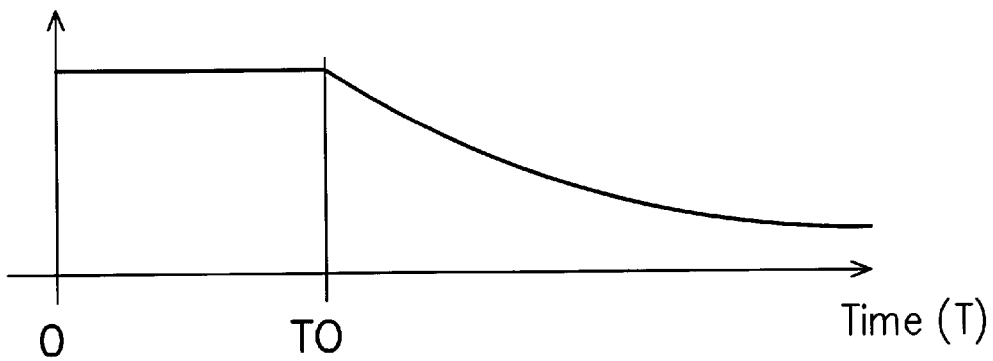
FIG. 5B is a graph, showing the drain-to-source current versus time characteristic of the MOS transistor in the periphery circuit in response to the voltage change shown in FIG. 5A.

In the fourth step, the gate voltage VGC applied to the gate of the NMOS transistor 34 is switched to a switched-off state, i.e., 0 V. In response, the capacitor voltage VSN at the node SN is changed due to loss of charge from the capacitor 36, causing a change in the drain-to-source current IDS of the NMOS transistor 38 in the periphery circuit 32. The IDS-T characteristic of the NMOS transistor 38 is illustrated in FIG. 5B.

(Step 5)

In the fifth step, the BISM3v3 model is used to determine the I-V characteristic of the NMOS transistor 38. From this I-V characteristic, the IDS-T characteristic of the NMOS transistor 38 can be obtained.

(Step 6)

Figure 5C:
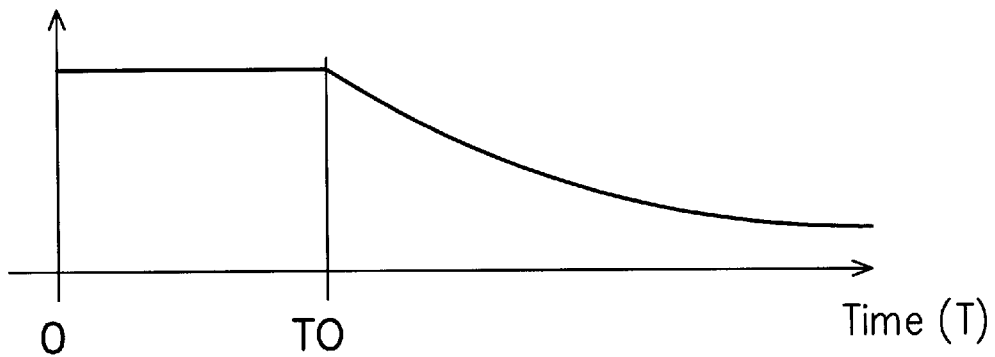
FIG. 5C is a graph, showing the capacitor voltage versus time characteristic of the DRAM cell in response to the voltage change shown in FIG. 5A.

In the sixth step, the VSN-T characteristic of the DRAM cell 30 can be obtained from the IDS-T characteristic of the NMOS transistor 38, as illustrated in FIG. 5C. From the VSN-T characteristic, the data retention time of the capacitor 36 can be determined.

Second Preferred Embodiment

Figure 4:
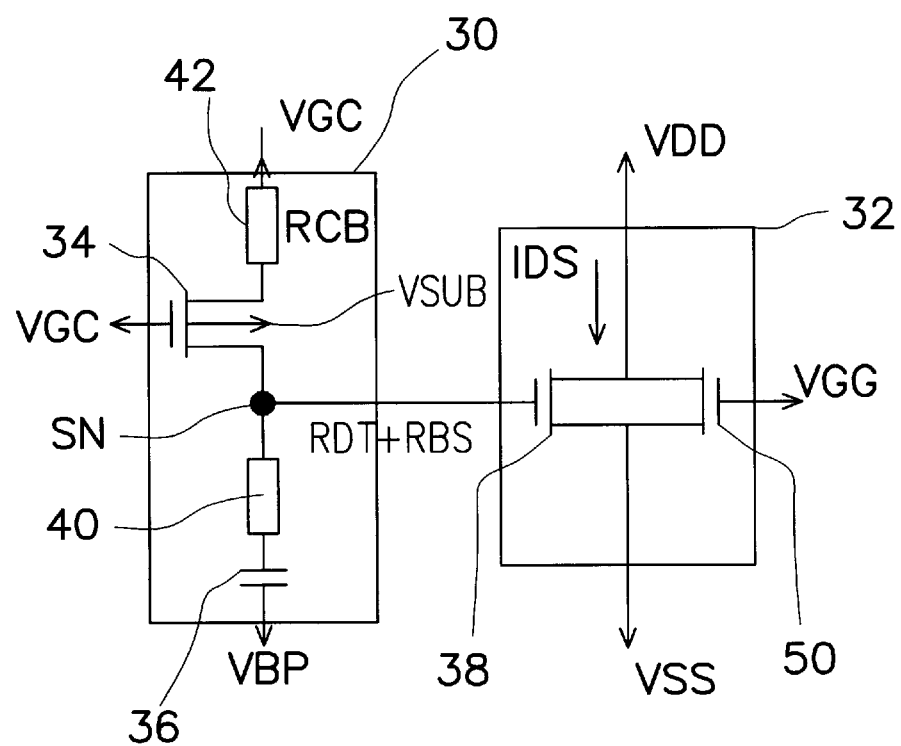
FIG. 4 is a schematic diagram showing the circuit configuration of a DRAM cell coupled with a periphery circuit used to perform the second preferred embodiment of the invention.

A second preferred embodiment of the invention for DRAM data retention-time measurement is disclosed in the following with reference to FIG. 4.

In this embodiment, the circuit configuration differs from that of the previous embodiment only in that a second NMOS transistor 50 in addition to the first NMOS transistor 38 is provided in the periphery circuit 32. The first NMOS transistor 38 is connected in such a manner that its gate is connected to the node SN between the capacitor 36 and the source of the NMOS transistor 34, its source is connected to the source of the second NMOS transistor 50, and its drain is connected to the drain of the second NMOS transistor 50. Other than this, all the constituent components are the same as those in the previous embodiment and are labeled with the same reference numerals.

In accordance with the second preferred embodiment of the invention, taking the measurement of the data retention time for the DRAM cell 30 includes the following procedural steps.

(Step 1)

The first step is substantially the same as that in the previous embodiment, in which the same voltage levels for VGC, VCC, VBP, and VSS are applied, except that in this embodiment, a gate voltage VGG of –1 V is applied to the second NMOS transistor 50 in the periphery circuit 32, causing the NMOS transistor 50 to be switched to the OFF state.

(Steps 2 to 4)

The second to fourth steps are entirely the same as those of the previous embodiment. Through these steps, the IDS-T characteristic can be obtained, as illustrated in FIG. 5B.

(Step 5)

In the next step, the gate voltage VGC applied to the NMOS transistor 34 is switched to a switched-on state in a range of from 3.75 V to 4 V, so as to switch the NMOS transistor 34 to the ON state. Meanwhile, the VCC is switched to –1 V, causing VSN to be gradually pumped to –1 V, thereby switching the NMOS transistor 38 to the OFF state.

(Step 6)

In the next step, the gate voltage VGG applied to the NMOS transistor 50 is varied until its drain-to-source current IDS reaches the same level obtained by the steps (2) to (4). After this, VGG is equivalent to VSN; in other words, the NMOS transistor 38 is equivalent to the NMOS transistor 50.

The VSN-T characteristic of the DRAM cell 30 can be obtained from the IDS-T characteristic of the second NMOS transistor 50, and, from the VSN-T characteristic, the data retention time of the capacitor 36 can be determined.

Moreover, the parasitic capacitance between the gate of the NMOS transistor 38 and the node SN, which is about 1 pF, can be neglected.

In conclusion, the invention provides a circuit for measuring the data retention time of a DRAM cell, which allows the data retention time to be determined from the drain-to-source current versus time characteristic of the periphery circuit. By employing this method with the circuit, the measurement taken is more accurate than that obtained according to the prior art and is not affected by parasitic capacitance in the DRAM cell. The invention is therefore more advantageous than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A circuit for measuring a retention time of a memory cell of a dynamic random access memory (DRAM), the circuit comprising:

a DRAM memory cell, the DRAM memory cell comprising an N-type metal-oxide semiconductor (NMOS) transistor and a capacitor, where a source region of the NMOS transistor is coupled to a lower end of the capacitor, a drain region of the NMOS transistor is coupled to a first voltage, a gate electrode of the NMOS transistor is coupled to a second voltage, and a third voltage is applied onto an upper end of the capacitor, wherein there is a node between the NMOS transistor and the capacitor; and a periphery metal-oxide semiconductor (MOS) device, wherein a gate electrode of the periphery MOS device is coupled to the node used for receiving a voltage existing at the node, a drain region of the periphery MOS device is coupled to a fourth voltage, and a source region of the periphery MOS device is coupled to a fifth voltage.

2. The circuit of claim 1, wherein the first voltage applied to the DRAM memory cell comprises 1.8V, 2V, 2.5V, or one higher voltage, so as to maintain a high-voltage state.

3. The circuit of claim 1, wherein the first voltage applied to the DRAM memory cell remaining substantially at 0V, so as to maintain a low-voltage state.

4. The circuit of claim 1, wherein as the circuit is at a stage for measuring the retention time of the DRAM cell, the fourth voltage remains at a fixed quantity, and the fifth voltage is set at a zero voltage.

5. The circuit of claim 1, wherein the periphery MOS device comprises an N-type MOS transistor.

6. A circuit for measuring a retention time of a memory cell of a dynamic random access memory (DRAM), the circuit comprising:

a DRAM memory cell, the DRAM memory cell comprising an N-type metal-oxide semiconductor (NMOS) transistor and a capacitor, where a source region of the NMOS transistor is coupled to a lower end of the capacitor, a drain region of the NMOS transistor is coupled to a first voltage, a gate electrode of the NMOS transistor is coupled to a second voltage, and a third voltage is applied onto an upper end of the capacitor, wherein there is a node between the NMOS transistor and the capacitor;

a first periphery metal-oxide semiconductor (MOS) device, wherein a gate electrode of the first periphery MOS device is coupled to the node used for receiving a voltage existing at the node, a drain region of the first periphery MOS device is coupled to a fourth voltage, and a source region of the first periphery MOS device is coupled to a fifth voltage; and a second periphery MOS device, which is coupled with the first periphery MOS device in parallel, but a gate electrode of the second periphery MOS device is coupled to a sixth voltage.

7. The circuit of claim 6, wherein the first voltage applied to the DRAM memory cell comprises 1.8V, 2V, 2.5V, or one higher voltage, so as to maintain a high-voltage state.

8. The circuit of claim 6, wherein the first voltage applied to the DRAM memory cell remaining substantially at 0V, so as to maintain a low-voltage state.

9. The circuit of claim 6, wherein as the circuit is at a stage for measuring the retention time of the DRAM cell, the fourth voltage remains at a fixed quantity, and the fifth voltage is set at a zero voltage.

10. The circuit of claim 6, wherein the first and second periphery MOS devices comprise an N-type MOS transistor.

* * * * *